US006780781B2

(12) United States Patent
Odaka et al.

(10) Patent No.: US 6,780,781 B2
(45) Date of Patent: Aug. 24, 2004

(54) METHOD FOR MANUFACTURING AN ELECTRONIC DEVICE

(75) Inventors: Takahiro Odaka, Kokubunji (JP); Toshihiko Tanaka, Tokyo (JP); Takashi Hattori, Musashimurayama (JP); Hiroshi Fukuda, Kodaira (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/445,068

(22) Filed: May 27, 2003

(65) Prior Publication Data

US 2003/0224560 A1 Dec. 4, 2003

(30) Foreign Application Priority Data

May 31, 2002 (JP) ........................................ 2002-159776

(51) Int. Cl.[7] ........................ H01L 21/302; H01L 21/31; H01L 21/44
(52) U.S. Cl. ........................ 438/717; 438/531; 438/551; 438/552; 438/553; 438/555; 438/669; 438/671; 438/707; 438/708; 438/709; 438/717; 438/725; 438/736; 438/778; 438/780; 438/782; 438/942; 438/945; 438/947; 438/948; 438/949
(58) Field of Search ...................... 216/1–109; 438/531, 438/551–553, 555, 669, 671, 707–709, 717, 725, 736, 778, 780, 782, 942, 945, 947–949; 430/1–967

(56) References Cited

U.S. PATENT DOCUMENTS 5,254,439 A  * 10/1993 Tani et al. ................. 430/326

FOREIGN PATENT DOCUMENTS

| JP | 5-289307 | 4/1992 |
| JP | 2001-324795 | 5/2000 |

* cited by examiner

*Primary Examiner*—John F. Neibling
*Assistant Examiner*—Stanetta Isaac
(74) *Attorney, Agent, or Firm*—Reed Smith LLP; Stanley P. Fisher, Esq.; Juan Carlos A. Marquez, Esq.

(57) ABSTRACT

A method for manufacturing an electronic device is provided. In one example of the method, the method prevents deformation of a resist mask caused by the irradiation of exposure light. The resist mask has a resist as an opaque element, and can afford mask patterns undergoing little change even with an increase in the number of wafers subjected to exposure processing. The resist mask maintains a high dimensional accuracy. A photomask pattern is formed using as an opaque element a resist comprising a base resin and Si incorporated therein or a resist with a metal such as Si incorporated thereby by a silylation process, to improve the resistance to active oxygen. The deformation of a resist opaque pattern in a photomask is prevented. The dimensional accuracy of patterns transferred onto a Si wafer is improved in repeated use of the photomask.

13 Claims, 7 Drawing Sheets

METHOD FOR MANUFACTURING AN ELECTRONIC DEVICE

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

The present invention generally relates to a method for manufacturing an electronic device such as a semiconductor integrated circuit device, a super conductive device, a micromachine, a TFT, or a wiring substrate. More particularly, the invention is related to a technique for manufacturing an electronic device that is effective in its application to a lithography technique used in a semiconductor integrated circuit device manufacturing process.

2. Discussion of Background

In the manufacture of a semiconductor integrated circuit device there is used a lithography technique as means for forming a fine pattern on a wafer. In the lithography technique there mainly is employed a projection exposure system. A pattern of a photomask (mask) attached to the projection exposure system is transferred onto the wafer to form a device pattern.

An ordinary mask is fabricated by patterning a metallic film having a light shielding property such as a film of chromium (Cr) formed on a transparent mask substrate, or by patterning an inorganic film having a light attenuating or shielding property such as a film of MoSi, ZrSiO, or SiN formed on a transparent mask substrate. That is, an ordinary mask includes the above metallic film or inorganic film formed in a desired shape on a transparent mask.

The aforesaid metallic film or inorganic film is usually formed by a sputtering method. For example, the metallic film is subjected to the following processing. First, a resist film is applied onto the metallic film and thereafter a desired pattern is written on the resist film by an electron beam exposure system or a laser writer. Subsequently, a resist pattern of a desired shape is formed by development. Then with the resist pattern is used as a masking layer. The metallic film is then patterned, for example, by dry etching or wet etching. Thereafter, the resist pattern is removed, followed by washing, etc., to form on a transparent substrate an opaque pattern of a desired shape mainly made of the metallic film. The mask using the inorganic film is also fabricated by the same process.

Unfortunately, the mask of this construction involves the problem that the number of manufacturing steps is large and that the cost therefore increases. With a view to simplifying the mask fabricating process and reducing the cost, for example, in JP-A No. 289307/1993 there is disclosed what is called a resist mask method in which an opaque element is formed by a resist film. This method utilizes such a property of an ordinary electron beam-sensitive resist film or a photosensitive resist film as shields vacuum ultraviolet light having a wavelength of not longer than 200 nm or so. According to this method, an opaque film etching step and a resist film removing step are not necessary, thus permitting reduction of the mask cost and shortening of turn around time (TAT) as a result of simplification of the process.

Recently, with competition in the development of semiconductor integrated circuit devices, it has become necessary to use plural sheets of mask because of the necessity of accelerating a device debug, and a quick fabrication of low-cost mask has been becoming more and more necessary. This requirement is increasing desirable under a recent increase in the demand for system LSIs which are manufactured in a wide variety, small lot production mode. Thus, there is an increased demand for quick mask fabrication and reduction of mask costs.

A phase shift method is known as a lithography technique for forming a fine pattern of submicron or smaller. One of the masks employed in this method uses a halftone phase shift mask. In this mask, a translucent film is disposed in a pattern opening to invert the phase of light passing between adjacent patterns, thereby enhancing the light intensity contrast of a transfer image. With this mask, it becomes possible to form a fine pattern of a sub-wavelength size on a wafer. The fabrication of this halftone mask requires a larger number of manufacturing steps than in the manufacture of an ordinary binary mask. Consequently, the cost of the mask is extremely high in comparison with the ordinary Cr mask. In an effort to eliminate such a drawback there has been proposed a halftone type resist mask in which a translucent phase film is formed by a photosensitive translucent film using resist to attain a further reduction of cost. This resist mask is disclosed, for example, in JP-A No. 324795/2001.

The resist mask is very effective in reducing cost and shortening TAT. Unfortunately, the resist film as an opaque element is formed of an organic material and is therefore apt to react with light used in exposure. Also, patterns tend to deform by repeated exposure to excimer laser beam, such as ArF or KrF.

SUMMARY OF THE INVENTION

It has been recognized that what is needed is solutions to such problems as the deterioration in accuracy of transfer patterns caused by the deformation in shape of resist patterns and changes in light absorption and phase difference during the fabrication of semiconductors. Broadly speaking, the present invention fills these needs by providing a method for manufacturing an electronic device. It should be appreciated that the present invention can be implemented in numerous ways, including as a process, an apparatus, a system, a device or a method. Several inventive embodiments of the present invention are described below.

According to one embodiment, a mask opaque element is formed using a resist comprised of a resin, the resin containing a IV group element such as silicon or germanium or an iodonium compound or a metal, whereby the problem of irradiation durability being insufficient and the pattern size varying with exposure is solved. Upon radiation of light onto a resist opaque pattern, reaction proceeds from a surface side and there occurred a decrease of film. Also, the surroundings of a mask in an exposure system are in the air and, consequently, active oxygen generated by the irradiation of such excimer laser beam as ArF or KrF causes a change in film thickness and a dimensional change.

In other words, a surface reaction of resist with etching occurs based on active oxygen as a main reaction. Accordingly, for protecting the resist as an organic matter from active oxygen, an IV group element such as silicon or germanium, or an iodonium compound, or a metal is incorporated in the resist to decrease the etching rate.

In another embodiment, a photosensitive, transparent Si-containing resist and an organic composition having sensitivity to excimer laser beam as exposure light are mixed together to adjust the transmittance. The resist thereby obtained is used as a translucent film to form a halftone mask. The adjustment of phase angle is conducted by adjusting the film thickness of a shield resist pattern.

There may be a fear that the organic composition used for adjusting both transmittance and phase may react upon irradiation of exposure light, resulting in both transmittance and phase being changed. With the Si-containing resist, however, it is possible to suppress the occurrence of a change in both transmittance and phase.

In still another embodiment, after a resist pattern is formed on the mask, a transparent organic film is formed on the pattern to further suppress the change in both transmittance and phase of the resist which is a halftone film.

The invention encompasses other embodiments of a method, an apparatus, and a computer-readable medium, which are configured as set forth above and with other features and alternatives.

BRIEF DESCRIPTION OF THE DRAWINGS

The present invention will be readily understood by the following detailed description in conjunction with the accompanying drawings. To facilitate this description, like reference numerals designate like structural elements.

DESCRIPTION OF THE PREFERRED EMBODIMENTS

An invention for a method for manufacturing an electronic device is disclosed. Numerous specific details are set forth in order to provide a thorough understanding of the present invention. It will be understood, however, to one skilled in the art, that the present invention may be practiced without some or all of these specific details.

Before describing the present invention in detail, meanings of some terms will be explained below.

"Opaque" means having an optical characteristic such that the proportion of transmitting light in the exposure light radiated to the area concerned is less than 1%.

"Attenuation" means having an optical characteristic such that the proportion of transmitting light in the exposure light radiated to the area concerned is in the range from 1% to less than 40%, usually several percentages less than 25%. On the other hand, "transparent" means having an optical characteristic which permits 60% or more, usually 90% or more, of exposure light radiated to the area concerned to pass through the area.

"Photoresist pattern" means a film pattern obtained by patterning a photosensitive organic film with use of the photography technique. This pattern covers a mere resist film having no opening with respect to the portion concerned.

A first embodiment of the present invention relates to a method for preventing the deformation of patterns of a binary mask using resist as an opaque element and thereby obtaining transfer patterns of a high dimensional accuracy. A mask opaque resist is used comprising an Si-containing base resin. In this resist there cresol novolak resin is used as the base resin, polyphenylsilsesquioxane as a silicon-containing resin, and diazonaphthoquinone as a photosensitive material. Having a benzene ring in the base resin, this resist exhibits a strong absorption at 193 nm which is the exposure wavelength of ArF excimer laser beam, and thus functions to a satisfactory extent as a shield member in ArF mask. Absorbance was found to be not less than 15/μm. Thus, with a film thickness of not smaller than 0.2 μm, there is obtained an OD value of 3 or more, proving a satisfactory light shielding property. The OD value indicates a value represented by $-\text{Log}(I/I_0)$, assuming that the quantity of light incident on film is $I_0$ and the quantity of light passing through the film is I.

Figure 1A:
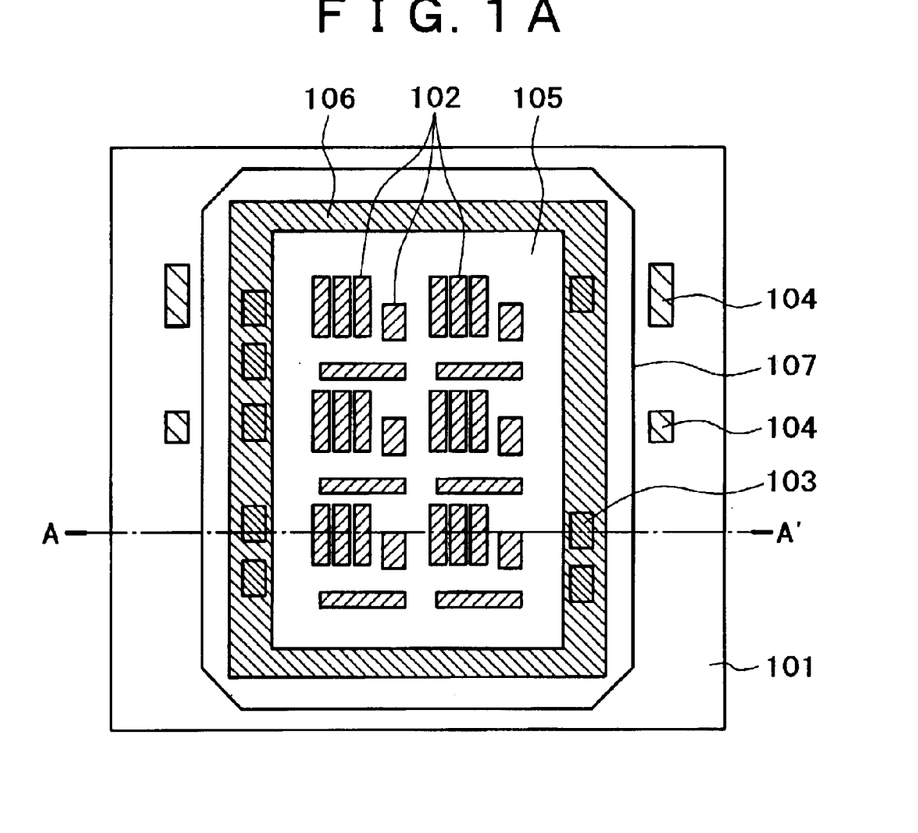
FIG. 1A is top-view of a mask fabricated using this resist as an opaque element, in accordance with one embodiment of the present invention.
Figure 1B:
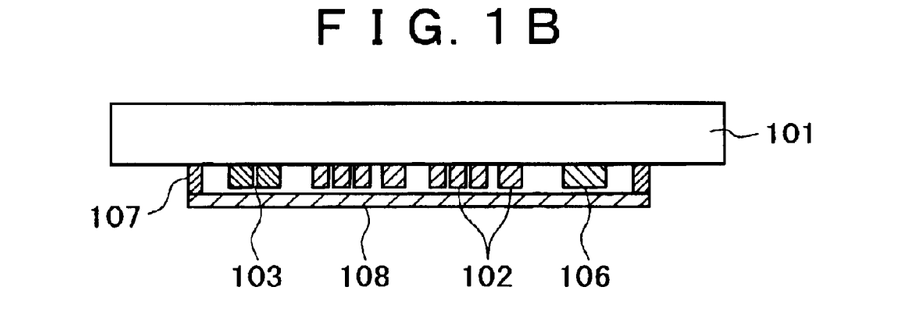
FIG. 1B is a side-view of a mask fabricated using this resist as an opaque element, in accordance with one embodiment of the present invention.

FIG. 1A and FIG. 1B illustrate an appearance of a mask fabricated using this resist as an opaque element, in accordance with one embodiment of the present invention. The resist was applied onto a quartz plate 101. Opaque patterns 102 were formed by means of a laser writer. Mask alignment marks 103 are formed within a Cr opaque frame 106. But this is merely one example and in the case where such a short wavelength light as ArF excimer laser beam is used as mask alignment detecting light, the opaque frame 106 may be formed using resist. The mask includes a mask drawing alignment mark 104 and an exposable area 105 in an exposure system. After patterning, a pellicle frame 107 was provided on the mask substrate and a pellicle 108 was mounted. By means of an ArF excimer laser exposure system, using this mask, the transfer of patterns is conducted repeatedly. As a result, the change of the mask pattern size is reduced to a half in comparison with the case of using a resist comprising cresol novolak resin with a silicon resin not incorporated therein and diazonaphthoquinone, and it turns out that the deformation of opaque patterns on the mask could be suppressed.

A dimensional change of 60 nm on the mask per 1 kJ/m$^2$ of exposure dose is decreased to a change of 30 nm by this method.

Although in the embodiment discussed with reference to FIG. 1A and FIG. 1B, a silicon-containing resin is incorporated in the base resin for preventing the deformation of patterns, the silicon may be substituted, for example, by a compound which contains an IV group element, such as germanium, or an iodonium compound, or a metallic compound. However, the silicon-containing resist was found to be the easiest to use to attain a high resolution.

As examples of the silicon-containing resin, in addition to polyphenylsilsesquioxane, other resins that may be used include polyhydroxybenzylsilsesquioxane, polytrimethylsilylstyrene, poly(trimehylsilylstyrene-cohydroxystyrene), polydimethyiphenyl siloxane, poly(silylphenylene-co-siloxane), poly(p-disilaphenylene), polymethacryloxyethyltris(trimethylsilyl)silane, and polytris(trimethylsiloxy)silylpropyl methacrylate.

In a second embodiment of the present invention, a halftone phase shift mask is used having an attenuation pattern obtained by adjusting the transmittance of the silicon-containing resist described in the embodiment above with reference to FIG. 1A and FIG. 1B. In the present embodiment, a resist is used that includes cresol novolak resin as a base resin, polyphenylsilsesquioxane as a silicon-containing resin, and diazonaphthoquinone as a photosensitive material, and patterns were formed on a quartz substrate with use of a laser writer. In this embodiment, however, the transmittance is increased by increasing the proportion of the silicon-containing resin, and adjustment is made so as to give a transmittance of 10% and a phase angle of π. At this stage, a dimensional change of this resist pattern (mask pattern) in ArF excimer laser exposure is decreased as in the embodiment discussed above with reference to FIG. 1A and FIG. 1B.

The photosensitive resist used in the present embodiment is not limited to one specific type. For example, there may be used a chemically amplified positive type electron beam resist of a polyhydroxystyrene resin. Also as to the transmittance, no relevant limitation is made to 10%, but a transmittance in the range of 1% to 25% is employable by changing the concentration of the silicon-containing resin. In connection with a halftone phase shift mask it is known that a virtual image caused by a phase inversion effect (i.e., sub-peak) occurs outside the image of a real pattern. But the transfer of the sub-peak can be prevented by adjusting the transmittance. At a transmittance of 1–4%, an exposure latitude improving effect without paying attention to the sub-peak is obtained. A transmittance of 4–6% is applicable to such a pattern layout as it avoids a quadruple point (a specific point at which diffracted lights from all sides strengthen mutually in a mutually strengthening direction) of the sub-peak, and the exposure latitude becomes wide. A transmittance of 6–12% is applicable to such a pattern layout as it avoids a triple or more point, and the resolution is improved. At a transmittance of 12–25% the resolution is improved particularly in the case of isolated patterns such as isolated holes. Thus, it turns out that there could be obtained an effect by adjusting the mixing ratio between the silicon-containing resin and the ordinary resist in accordance with pattern layout and thereby adjusting the transmittance used to 1–25%.

The smaller the amount of film decrease in development is used in the resist, the easier it is to affect phase control. Although in this embodiment the phase difference was set at π, it may be 3π, using a larger value like 5π should be avoided because it would result in an increase in the resist film thickness, and the transfer accuracy would be badly influenced.

Next, an example of two layers applied to a halftone phase shift mask will be discussed. The two layers are fabricated by depositing chromium (Cr) to a thickness of 20 nm on a glass substrate and forming thereon a Si-containing resist to a thickness of 150 nm. In this case, a satisfactory shielding property against exposure light can be ensured stably by the chromium (Cr) layer, while a 180°-inverted phase shift can be adjusted by adjusting the film thickness of the Si-containing resist. Since the Si-containing resist has resistance to radiated exposure light, the change of film thickness is kept small and the phase shift is scarcely deviated.

After fabrication of this mask, a transparent organic film having an oxygen cut-off characteristic is formed on each mask pattern to a thickness of 60 nm, which is a thickness that does not constitute a relevant limitation. Polyvinyl alcohol (PVA) is used the material of the organic film, but the embodiment is not limited thereto. Any organic film may be used if it has an oxygen cut-off characteristic and can be formed with high flatness uniformly between mask patterns. By the above method, it is possible to decrease the transmittance and phase change of the resist pattern to within 1%.

Figure 2A:
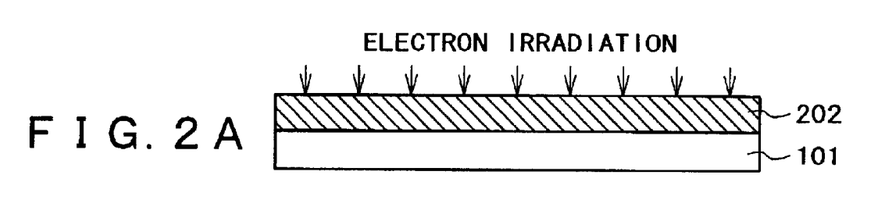
FIG. 2A illustrates a first stage of a method for preventing the deformation of a resist opaque pattern, in accordance with one embodiment of the present invention.
Figure 2B:
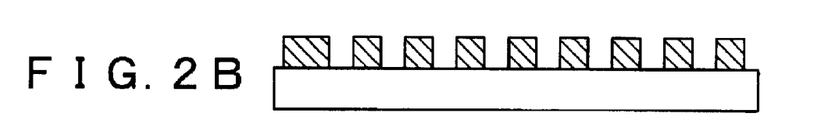
FIG. 2B illustrates a second stage of a method for preventing the deformation of a resist opaque pattern, in accordance with one embodiment of the present invention.
Figure 2C:
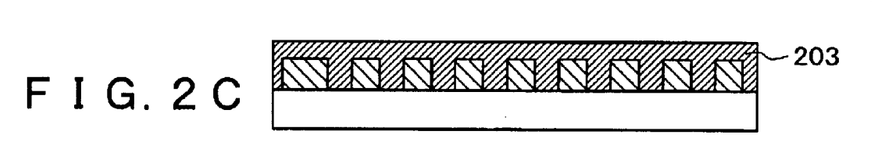
FIG. 2C illustrates a third stage of a method for preventing the deformation of a resist opaque pattern, in accordance with one embodiment of the present invention.

FIG. 2A to FIG. 2E illustrate a third embodiment of a method for preventing the deformation of a resist opaque pattern, in accordance with one embodiment of the present invention. By means of an electron beam writer, using a conventional electron beam-sensitive positive type resist, a resist pattern 202 is drawn on a quartz plate 101 (FIG. 2A), followed by development using a conventional developer to form patterns (FIG. 2B). These mask patterns are exposed to deep UV light, allowing an alkali soluble group to be produced on each pattern surface. Thereafter, a xylene solution 203 is added dropwise (FIG. 2C), the xylene solution 203 containing bisdimethylaminodimethylsilane as a silylating reagent and 2-ethoxyethyl acetate (ECA) as a resist diffusion promoter, to form a silylation layer (FIG.

Figure 2D:
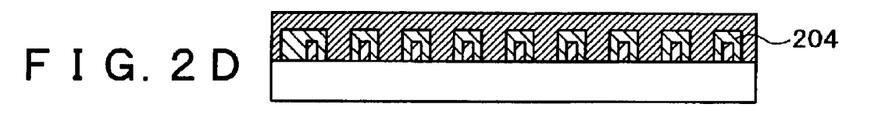
FIG. 2D illustrates a fourth stage of a method for preventing the deformation of a resist opaque pattern, in accordance with one embodiment of the present invention.
Figure 2E:
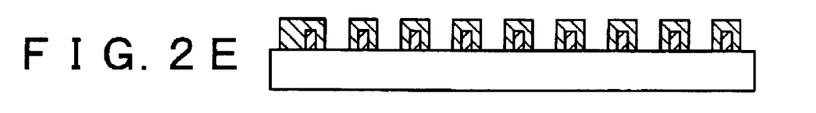
FIG. 2E illustrates a fifth stage of a method for preventing the deformation of a resist opaque pattern, in accordance with one embodiment of the present invention.

2D). Thereafter, the quartz plate is rotated to dissipate the volatile solvent. Xylene is added dropwise to effect rinsing, thereby affording a resist mask with a silylation layer 204 grown on the surface thereof. By carrying out such silylation, the resistance to active oxygen produced upon radiation of exposure light to resist patterns as opaque elements is improved. As a result, the amount of film decrease and a dimensional change of the resist opaque patterns by exposure could be reduced to a half in comparison with the use of a conventional electron beam-sensitive positive resist.

It is known that pattern swelling occurs to some extent during silylation. As in this embodiment, to improve the irradiation durability of resist patterns by the silylation of the same patterns, it is necessary to optimize conditions so that the pattern swelling is held within several nanometers.

Although in this embodiment an electron beam-sensitive resist is used as the resist, any other resist may be used if the resist has a light shielding property against exposure light, if the resist produces an alkali soluble group upon exposure to deep UV light, and if the resist can undergo silylation.

As the silylating reagent, hexamethylcyclotrisilazane or bisdimethylaminomethylsilane, other than ECA, may be used for example. As the resist diffusion promoter, in addition to 2-ethoxyethyl acetate, any of 2-butoxyethyl acetate, n-propyl acetate, N-methyl-2-pyrrolidone, and n-buthyl alcohol may be used for example. Although in this method, silylation is performed by a liquid phase silylation method, a vapor phase silylation method may be used. Thus, by incorporating silicon in the resist after the formation of resist patterns, it is possible to improve the irradiation durability and reduce the change in pattern size to a half.

Although in this embodiment silicon is incorporated in the patterns, any material which is effective in improving the irradiation durability such as a metal derivative may be substituted for silicon. An important feature of this method is that that first a silicon pattern is formed and then silicon is introduced therein. Silicon can thereby be introduced at a high concentration without badly influencing the resolution in pattern formation.

In a fourth embodiment, a method is used to fabricated a semiconductor device using a photomask. The semiconductor device fabricated here is a semiconductor integrated circuit device having a twin well type complementary metal insulator semiconductor (CMIS) circuit.

Figure 3A:
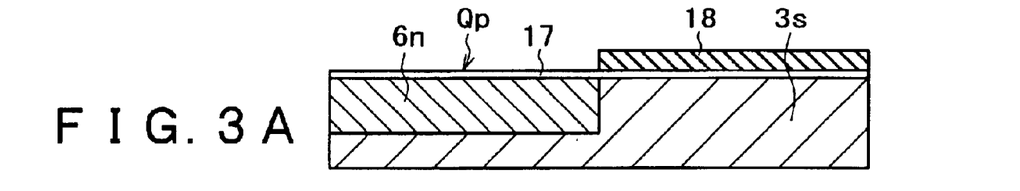
FIG. 3A is a cross-sectional view of a principal portion of a semiconductor wafer in a first stage of the manufacturing process, in accordance with one embodiment of the present invention.

FIG. 3A through FIG. 3F illustrate a cross-sectional view of a principal portion of a semiconductor wafer 3 in the manufacturing process, in accordance with one embodiment of the present invention. A semiconductor substrate 3s which constitutes the semiconductor wafer is constituted, for example, by an n-type Si single crystal having a circular plane. In an upper portion of the semiconductor substrate 3s n-well 6n and p-well 6p is formed. Phosphorus or As is introduced into the n-well 6n as an n-type impurity Likewise, boron as a p-type impurity is introduced into the p-well 6p. The n- and p-well are formed in the following manner. First, a wafer alignment mark (not shown) for mask alignment is formed on the semiconductor substrate 3s. This wafer alignment mark may also be formed during well formation by adding a selective oxidation step. Thereafter, an oxide film 17 is formed on the semiconductor substrate 3s as shown in FIG. 3A and subsequently a resist pattern 18 for implantation mask is formed on the oxide film 17, followed by ion-implantation of phosphorus. For forming the resist pattern 18 for implantation mask, a photomask containing Cr IS used as an opaque element.

Figure 3B:
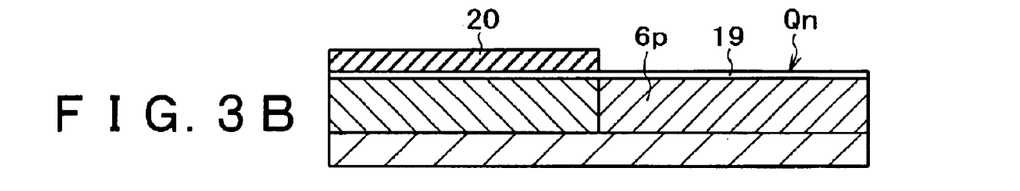
FIG. 3B is a cross-sectional view of a principal portion of a semiconductor wafer in a second stage of the manufacturing process, in accordance with one embodiment of the present invention.

Thereafter, the resist 18 is removed by ashing. After removal of the oxide film 17, an oxide film 19 is formed on the semiconductor substrate 3s as shown in FIG. 3B. Next, a resist pattern 20 is formed on the oxide film 19 for the implantation mask and subsequent ion-implantation of phosphorus. For the formation of the resist pattern 20 for the implantation mask, a photomask containing Cr is used as an opaque element. In these masks for implantation, an object pattern width is 0.8 $\mu$m on wafer (3.2 $\mu$m on mask). A required accuracy is as relatively large as ±15% with respect to an object size. Thus, even with Cr mask, the influence exerted on the entire manufacturing cost is minimal.

Figure 3C:
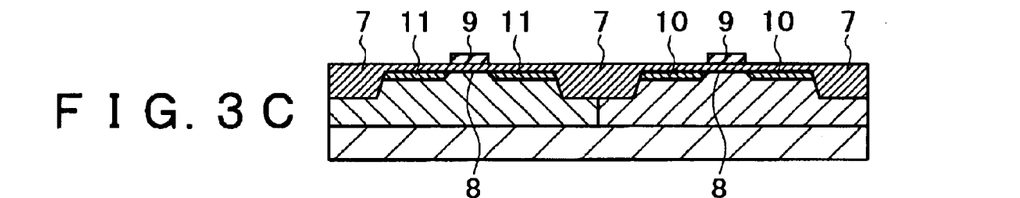
FIG. 3C is a cross-sectional view of a principal portion of a semiconductor wafer in a third stage of the manufacturing process, in accordance with one embodiment of the present invention.

Thereafter, the resist 20 and the oxide film 19 are removed. Field isolation layers 7 for separation include, for example, a silicon oxide film formed in the trench isolation on a main surface (a first main surface) of the semiconductor substrate 3s (FIG. 3C). For the isolation, a LOCOS (Local Oxidation of Silicon) method may be used. However, the LOCOS method involves the problem that the layout size becomes large, for example, due to elongation of bird's beak. As a photomask in this isolation fabrication, the photomask using resist as an opaque element, which was described above in this first embodiment, was used.

In active regions surrounded by field isolation layers 7, nMIS Qn and pMIS Qp are formed. Gate insulation films 8 in the nMIS Qn and pMIS Qp are formed, for example, by a silicon oxide film using a thermal oxidation method. As to gate electrodes 9 in the nMIS Qn and pMIS Qp, they are each formed by the steps of depositing a gate-forming film of, for example, a low resistance polysilicon by CVD. The film is then subjected to lithography using an ArF excimer laser stepper, using the mask including resist as an opaque element, which is described in the first embodiment. Etching is then performed. The conventional mask using resist as an opaque element is advantageous in that, as compared with a Cr mask, the cost is low and highly accurate patterns can be formed. However, the mask using resist as an opaque element described above in the first embodiment is remarkably improved in its irradiation durability in comparison with the conventional mask. Accordingly the mask is a long-life mask causing neither a film decrease of mask patterns nor a dimensional change upon exposure. As a result, the mask permits gate processing to be done with high accuracy during mass-production of semiconductor integrated circuits. The fact that mask patterns, especially gate electrodes, can be formed with high accuracy using such a long-life resist mask is remarkable, particularly if done so during mass production of semiconductor integrated circuits.

A semiconductor area 10 in nMIS Qn is formed self-alignmentwise with respect to the associated gate electrode 9 by introducing, for example, phosphorus or arsenic into the semiconductor substrate 3s in accordance with an ion implantation method using the gate electrode 9 as mask. A semiconductor area 11 in p-MIS Qp is formed self-alignmentwise with respect to the associated gate electrode 9 by introducing, for example, boron into the semiconductor substrate 3e using the gate electrode 9 as mask. However, each gate electrode 9 is not limited to being formed by a monolithic film of a low resistance polysilicon. Various changes may be made. For example, the gate electrode 9 may be of a polycide structure in which a silicide layer such as a layer of tungsten silicide or cobalt silicide is provided on a polysilicon film of a low resistance. Alternatively, a polymetal structure may be adopted wherein a metal film such as a tungsten film is provided on, for example, a polysilicon film of a low resistance through a barrier conductor film such as a titanium nitride film or a tungsten nitride film.

Figure 3D:
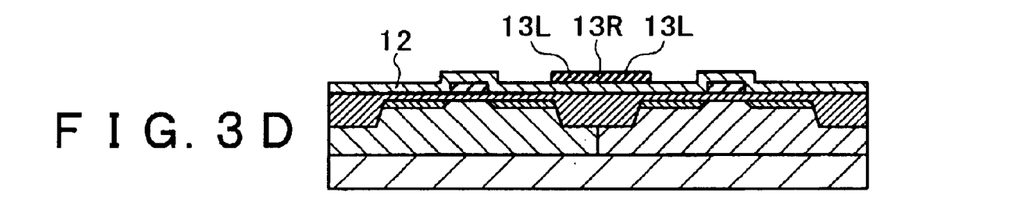
FIG. 3D is a cross-sectional view of a principal portion of a semiconductor wafer in a fourth stage of the manufacturing process, in accordance with one embodiment of the present invention.

As shown in FIG. 3D, an inter-layer dielectric film 12, for example, silicon oxide film, is deposited onto the semiconductor substrate 3s described above by CVD for example. Thereafter, a polysilicon film is deposited on an upper surface of the inter-layer dielectric film 12 by CVD for example.

Subsequently, the polysilicon film is subjected to lithography with use of the photomask using resist as an opaque element, which is described above in the first embodiment. This lithography is followed by etching for patterning. An impurity is then introduced into a predetermined area of the thus-patterned polysilicon film, thereby forming wirings 13L and resistors 13R of polysilicon film.

Figure 3E:
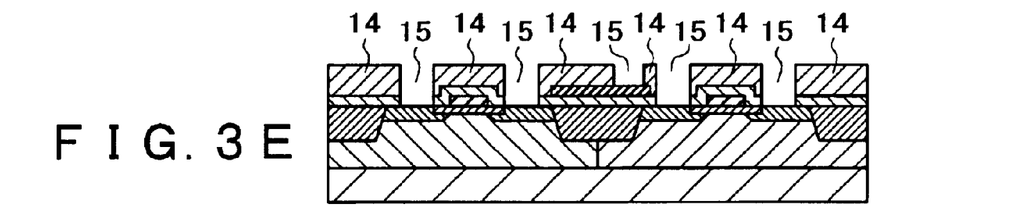
FIG. 3E is a cross-sectional view of a principal portion of a semiconductor wafer in a fifth stage of the manufacturing process, in accordance with one embodiment of the present invention.

Thereafter, as shown in FIG. 3E, a silicon oxide film 14 is deposited on the semiconductor substrate 3s by CVD or any other suitable method. Via holes 15 are then formed in the inter-layer dielectric film 12 and silicon oxide film 14 such that the semiconductor areas 10, 11 and wirings 13L are partially exposed therein by performing lithography with use of the photomask using resist as an opaque element as described above in the first embodiment, and by subsequent etching to form holes.

Figure 3F:
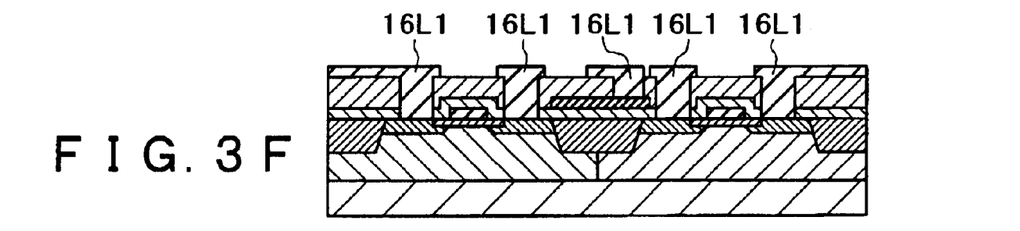
FIG. 3F, is a cross-sectional view of a principal portion of a semiconductor wafer in a sixth stage of the manufacturing process, in accordance with one embodiment of the present invention.

Further, metallic films of titanium (Ti), titanium nitride (TiN) and tungsten (W) are deposited successively onto the semiconductor substrate 3s by both sputtering and CVD. The metallic films are then subjected to lithography with use of the photomask using resist as an opaque element as described above in the first embodiment. This lithography is followed by etching to form first wirings 16L1, as shown in FIG. 3F. Second and further wirings are formed in the same way as in the formation of the first wirings 16L1 to fabricate a semiconductor integrated circuit device.

In this embodiment, seven sheets of the mask were used with resist as an opaque element, which is described above in the first embodiment. However, since this mask has a long degradation life, it is not necessary to re-fabricate the mask. Thus, the mask cost is greatly reduced.

Another feature of the present embodiment is that a resist pattern with little scum can be formed on a wafer. An ordinary resist containing a benzene ring absorbs a vacuum ultraviolet exposure light, such as ArF excimer laser beam, extremely effectively. The absorbance thereof reaches 20 $\mu$m−1. Accordingly, if there is a slight residue of resist, i.e., scum, on the photomask, it will be transferred as mask and cause a defect. On the other hand, if silicon is contained in the resist, the light shielding property of the vacuum ultraviolet light is slightly deteriorated and a slight residue of resist would not cause the transfer thereof. That is, the defective transfer of scum on the mask is remedied.

Actually, it turns out that when a semiconductor integrated circuit of 130 nm node is fabricated using the ordinary resist and using ArF excimer laser beam as exposure light, even a 10 nm residue of resist on mask causes a transfer size defect, resulting in a lowering of yield. This has been a serious problem because a scum residue of 10 nm cannot easily be detected. However, by incorporating silicon into resist it is possible to reduce the shield rate against ArF excimer laser beam by half and the scum margin increased twice as much. Therefore, even if there remains 10 nm resist on mask, the dimensional yield is no longer deteriorated.

In this embodiment, the binary mask using resist as an opaque element, which is described above in the first embodiment, is used. If the halftone mask is used with resist as an attenuation element, which is described in the second embodiment, the resolution and exposure latitude of these layers will be improved. Also in this case, as compared with the conventional halftone mask using resist as an attenuation element, the exposure life increased twice from the standpoint of dimensional change and three times from the standpoint of transmittance change.

Figure 4:
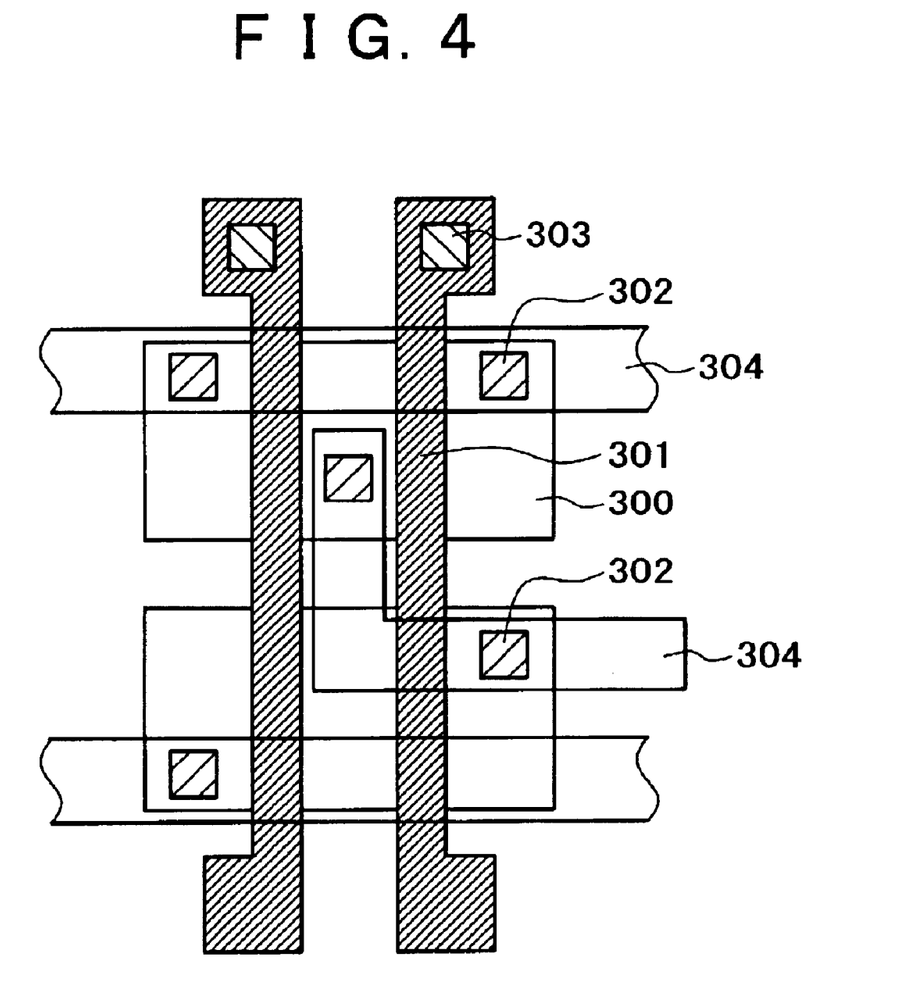
FIG. 4 illustrates a pattern layout of a semiconductor integrated circuit, in accordance with one embodiment of the present invention.

FIG. 4 illustrates a pattern layout of a semiconductor integrated circuit, in accordance with one embodiment of the present invention. The pattern layout includes a diffusion layer 300, a gate electrode 301, a contact hole 302 (substrate via hole), a wiring hole 303, and wiring 304. All of these patterns are formed with use of the foregoing photomask using Si-containing resist as mask material. With the conventional photomask using an Si-free resist as mask material, no problem arises in the initial stage of use. However, the mask pattern size changes as the number of wafers subjected to exposure processing increases. The pattern size on wafer also changes.

The following problems occurred with use of the conventional resist mask. A change in size of the gate electrode 301 causes a great change in metal oxide semiconductor (MOS) device characteristics, with consequent occurrence of an abnormal condition in the circuit operation. Each contact hole 302 becomes larger at every increase in the number of wafers subjected to exposure processing, such that the short margin for the gate electrode decreases, causing a lowering of yield. The via hole 303 becomes larger in its opening size as the number of wafers subjected to exposure processing increases. Coupled with an out-of-registration factor, if there is not made alignment with the underlying gate electrode, problems arise. Such problems include front-end chipping and penetration of a cleaning solution, leading to a lowering of yield. Another problem arises as to the wiring 304. This problem is a lowering of yield caused by non-alignment due to wiring that becomes thinner as the number of wafers subjected to exposure processing increases. On the other hand, when the aforementioned photomask using an Si-containing resist as mask material is used, the above problems are solved because there would be little dimensional change of patterns caused by an exposure processing.

Figure 5:
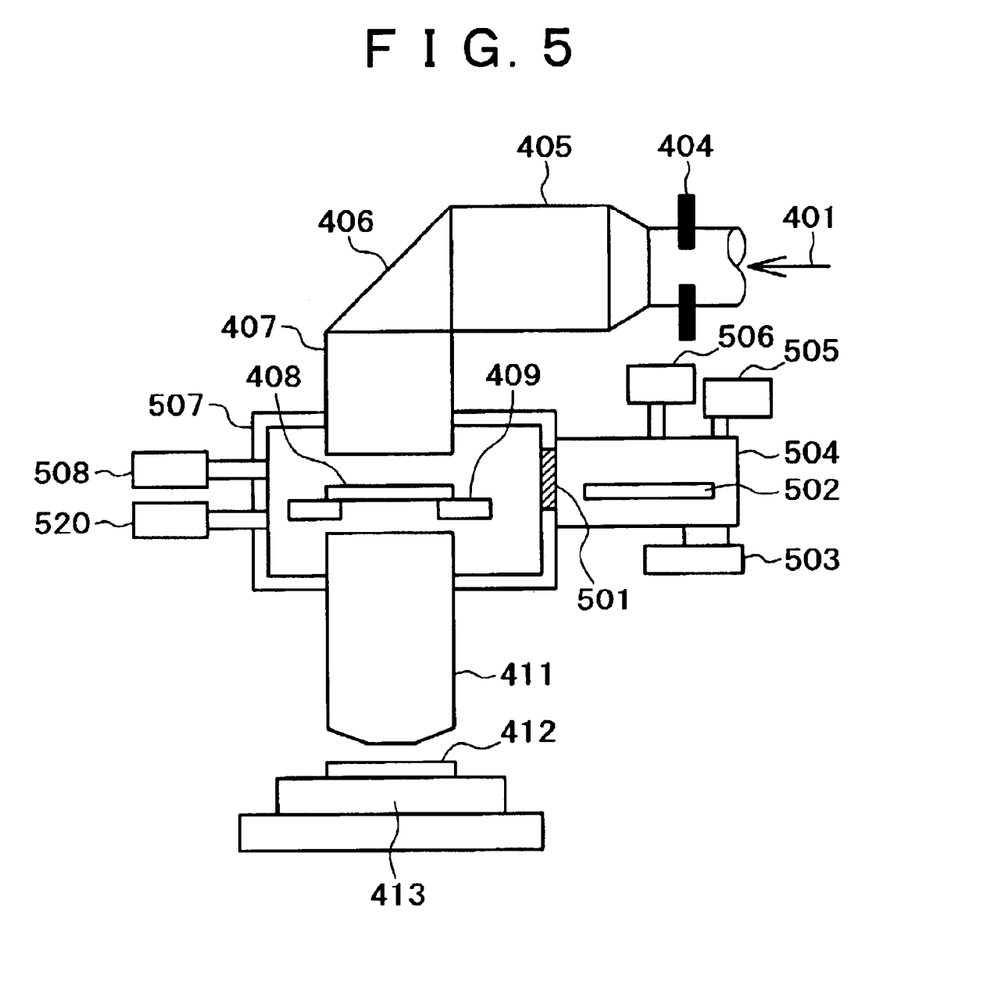
FIG. 5 illustrates a system for carrying out a method in which the vicinity of a mask stage of an exposure system is purged with an inert gas to prevent the deformation of a resist pattern, in accordance with one embodiment of the present invention.

FIG. 5 illustrates a fourth embodiment of a system for carrying out a method in which the vicinity of a mask stage of an exposure system is purged with an inert gas to prevent the deformation of a resist pattern, in accordance with one embodiment of the present invention. Light 401 emitted from an ArF excimer laser (not shown) illuminates a mask 408 through an illumination aperture 404 and condenser lenses 405–407. Patterns drawn on the mask 408 are transferred onto a wafer 412 under an imaging action of a projection lens 411.

The mask 408 using resist as an opaque element like that described in the first embodiment, before being placed on a mask stage 409, is provided in a mask waiting room 504 which is adjacent to a mask setting room 507 through a valve 501. The mask setting room 507 is purged with nitrogen by a nitrogen purge means 508 and is controlled by an oxygen concentration monitor 520 so that the oxygen concentration is maintained at a value of not greater than 10 ppm. The interior of the mask waiting room 504 is initially filled with the air. However, when the mask is introduced into the mask waiting room 504, nitrogen is repeatedly evacuated from and filled into the waiting room 504 by a nitrogen purge means 505 to effect nitrogen purge. Then, when an oxygen concentration monitor 506 determines that the oxygen concentration has dropped to a value of 10 ppm or less, the valve 501 is opened and the mask is introduced into the mask setting room 507 and is placed on the mask stage.

Through the above method, it is possible to maintain the oxygen concentration in the atmosphere around the mask at a value of not greater than 10 ppm and place the mask onto the mask stage. Although a pellicle is affixed to the mask, there poses no problem insofar as the pellicle has such a mechanism that permits easy purging of its interior.

If necessary, a deoxidizer or an oxygen concentration monitor may be provided inside a pellicle frame to maintain the oxygen concentration beforehand at a predetermined value or less. On the other hand, a semiconductor wafer 412 is mounted on a wafer stage 413. After the mask and the wafer have been positioned at a predetermined position by a conventional method, mask patterns are transferred onto the wafer.

Accordingly, it is possible to maintain the oxygen concentration around the mask using resist as an opaque element at a value of not higher than 10 ppm and also possible to effect the replacement of mask and the transfer of patterns. Consequently, it is possible to prevent a dimensional change of patterns in the resist mask used in the manufacture of such a semiconductor device as is typified by the previous fourth embodiment. It is also possible to form patterns precisely without causing a dimensional change of patterns in the fabrication of plural semiconductor devices.

Although nitrogen is mainly used for purging in this embodiment, any other gas may be used as long as the gas used is transparent to exposure light and inert to the resist used. For example, nitrogen may be substituted by an inert gas, such as helium or neon. Additionally, it is important that the oxygen concentration is low, and to this end the use of an oxygen absorbent is effective.

In a sixth embodiment, a resist is prepared by dispersing $SiO_2$ particles ranging in diameter from 8 to 10 nm in EB resist. A photomask was prepared using this resist is prepared. With an increase in the content of $SiO_2$ particles, the absorbance of the resist lowers in proportion to the said content. For example, when the content of $SiO_2$ particles become 25 wt % of the total resist solids content, the absorbance for ArF excimer laser beam lowers 25% from 20 $\mu m^{-1}$ to 15 $\mu m^{-1}$.

Film decrease and dimensional change against ArF excimer laser beam as exposure light become smaller as the $SiO_2$ particles content increases.

Figure 6:
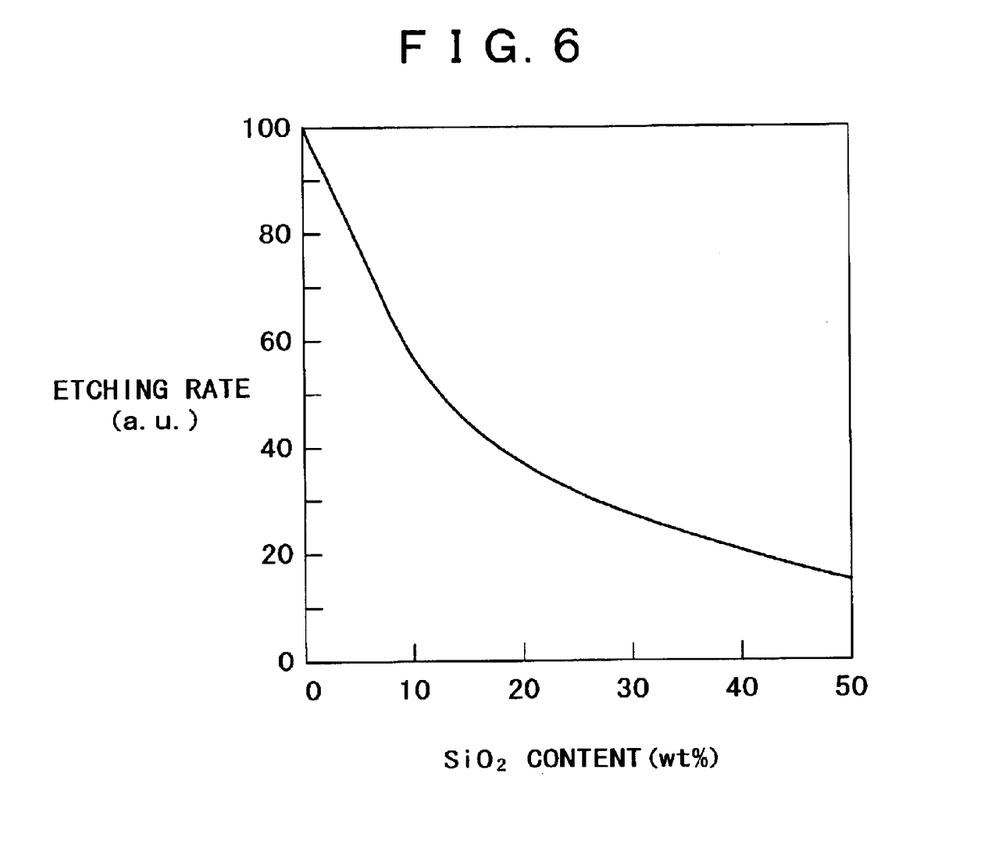
FIG. 6 is a chart showing the etching rate at which the resist film diminishes when irradiated with ArF excimer laser beam relative to $SiO_2$ particles content, in accordance with one embodiment of the present invention.

FIG. 6 is a chart showing the etching rate at which the resist film diminishes when irradiated with ArF excimer laser beam relative to $SiO_2$ particles content, in accordance with one embodiment of the present invention. The rate (relative rate) of the dimensional change also corresponds to the illustrated rate. The data illustrated in the same figure was obtained as a result of irradiation in the air.

With an increase of the $SiO_2$ particles content, resist film decrease and dimensional change becomes smaller. When the $SiO_2$ particles content increases beyond a certain value, the resolution of the resist lowers and the resist shape is deteriorated. As a result of various investigations, the shape deterioration becomes outstanding at an $SiO_2$ particles content exceeding 35 wt %. At an $SiO_2$ particles content of 25 wt % or lower, there is no problem in both resolution and shape insofar as the use as photomask is concerned. Thus, by adding fine $SiO_2$ particles to the resist, the irradiation durability is improved, and at a 25 wt % content thereof it is possible to reduce the film decrease and dimensional change to about one third.

In a seventh embodiment, it is known that a chemically amplified system can be constituted by mixing an acid generator, for example, into a silicon-containing resin where required, thereby making it possible to realize an alkali-developable photosensitive resist. In some of employable Si-containing resins, the value of light absorption at ArF wavelength can be controlled by adjusting the composition and structure of resin itself.

In this embodiment, a polymethylsilazane film formed by coating onto a mask substrate is subjected to electron beam plotting and alkali development to form mask patterns. Polymethylsilazane exhibits an extremely large light absorbing property for ArF wavelength, so with it alone, it could be used as a shield mask for ArF. However, if photooxidation occurs in the exposure atmosphere, Si—N linkage is converted to Si—O linkage, whereby the light transmittance of film increases. Therefore, it is desirable to take a measure for the prevention of oxidation. One example of such a measure is forming an oxygen shield film, such as an extremely thin carbon film throughout the whole pattern surface. Another example is removing oxygen from the exposure atmosphere as in the fifth embodiment.

On the other hand, as described in the fourth embodiment, since the novolak resin exhibits an extremely high light absorption at ArF wavelength, there has been the problem that a mere residue of a very fine scum in an opening portion of the fabricated mask would result in a decrease of light transmittance in that portion. This decrease influences heavily the dimensional accuracy of transferred patterns. After the formation of patterns of polymethylsilazane referred to above, if a predetermined heat treatment is performed in the presence of oxygen to convert a part of Si—N linkage into Si—O linkage, it is possible to adjust and control the light transmittance at ArF wavelength to a level which is optimal from the standpoint of scum transferability.

Further, according to this embodiment, the two characteristics—the phase of light having passed through the film and the light transmittance—can be adjusted and controlled each independently by changing the two parameters of heat treatment conditions and film thickness. Accordingly, as in the second embodiment, it is possible to realize a halftone mask having a desired transmittance. As noted previously, it is desirable to take a film oxidation preventing measure for avoiding a change in light transmittance caused by exposure. The embodiment is not limited to polymethylsilazane. For example, polymethylsilsesquiazane, which is preferable from the standpoint of crack resistance of film.

The value of light absorption may be controlled by mixing a photosensitive resist based on a silicon-containing resin (e.g., polymethylsilsesquioxane) that is transparent inherently sufficiently at ArF wavelength and a phenolic resin-based photosensitive resist that exhibits a strong light absorption at ArF wavelength. Thus, things that can be controlled include the light absorption to a level that is optimal from the standpoint of transferability, the phase of transmitted light, and the transmittance each independently.

According to the present invention it is possible to prevent the pattern deformation of a resist opaque element in a photomask. The dimensional accuracy of patterns transferred onto a silicon wafer in repeated use of mask is thereby improved.

Other Embodiments

The present invention includes, but is not limited to, the following embodiment.

An eighth embodiment relates to a method for preventing the deformation of patterns using oxygen plasma treatment and thereby obtaining transfer patterns of a higher dimensional accuracy.

Figure 7:
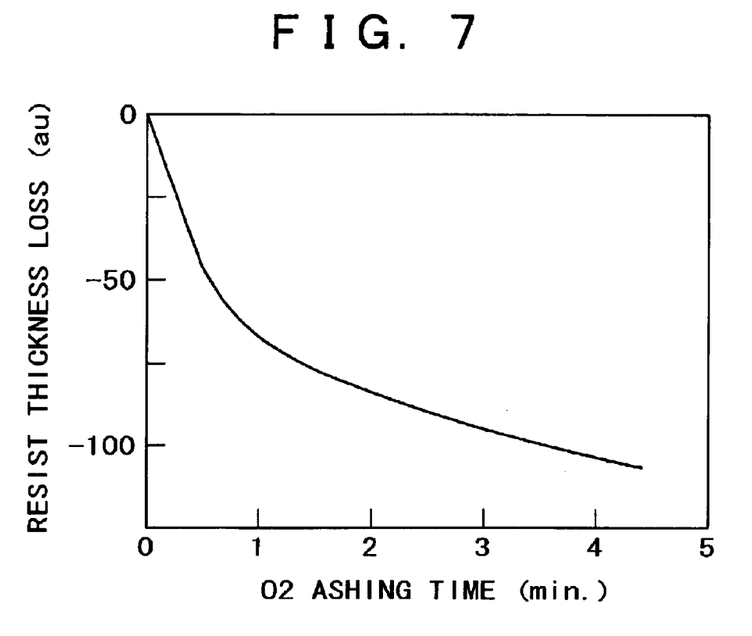
FIG. 7 is a graph showing the $O_2$ ashing characteristics of the resist, in accordance with an embodiment of the present invention.
Figure 8:
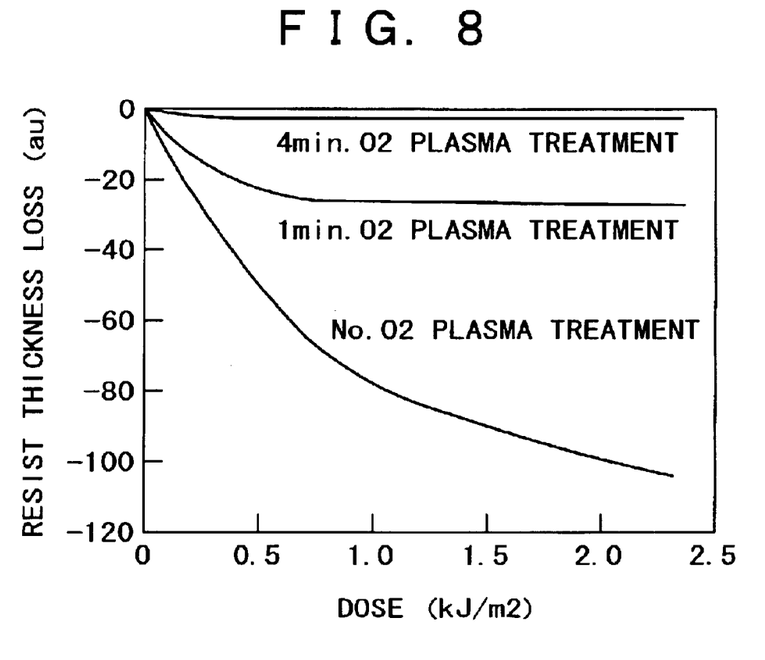
FIG. 8 is a graph showing the effect of the $O_2$ plasma treatment on resist thickness loss, in accordance with an embodiment of the present invention.

A Si-containing resist pattern is formed on a mask plate (glass plate) using the method as shown in the first embodiment. Thereafter, oxygen plasma is applied to the resist pattern. The oxygen plasma condition is 500 mTorr $O_2$ gas pressure and 600 W incident power. And the mask plate is heated on 120° C. The plasma treatment time is 1 and 4 minutes. As the resist thinning curve against oxygen plasma treatment ($O_2$ ashing) time is a saturated curve as shown in FIG. 7, the critical dimension controlability of the oxygen plasma treatment is sufficiently high. By the treatment, the resist thickness-loss caused by the irradiation of the exposure light is suppressed as shown in FIG. 8. That is, the resist is hardened against the irradiation of the exposure light. By the process the dimensional change of the mask pattern is diminished to a half without the oxygen plasma treatment process.

As a result of resist surface analyzation, Si of the resist component is oxidized, and a thin oxidized Si layer is formed on the resist surface. The thickness of the oxidized Si layer is 4 to 20 nm. It may be acted as a hard protecting (etching) barrier of the exposure light damage.

The above mentioned oxygen plasma treatment condition is only one example. Higher $O_2$ gas pressure is preferable because of higher density oxidized Si layer formation. And lower etching bias (bias between electrodes of plasma machine (asher)) is preferable because of lower resist thinning during the plasma treatment.

The resist stripping for the mask plate rework is done by oxygen with fluorocarbon gas plasma ashing. CF4 is used in this embodiment as the fluorocarbon gas. The gas flow rates of $O_2$ and $CF_4$ were 1700 and 150 sccm, respectively. As the $CF_4$ gas plasma slightly etches a mask plate glass, it is preferable that an $Al_2O_3$ film on the mask plate glass surface is formed. $Al_2O_3$ is transparent and has a high $CF_4$ plasma etch resistance. No bias plasma ashing of oxygen and fluorocarbon gases is good for the resist rework, because the glass substrate etching rate is very low. And the mask plate after the resist removing is cleaned up using a 0.5 wt % hydrofluoric acid and/or an ammonia and hydrogen peroxide solution. A mask plate can be cleanly reworked by the process.

There is the method using a remover solution such as pyrrolidone, sulfonic acid ester solution, amine solution, sulfuric acid with ozone as another rework method.

Though a Si-containing resist is used in this embodiment, a silylated resist as shown in the third embodiment also can be used. The oxygen plasma ashing process is also effective for a silylated resist pattern.

In a ninth embodiment of the present invention, Si-containing resist comprising a phenolic resin having Si-containing functional groups introduced to the side-chains was patterned on a mask substrate. Then, a surface treatment by an ashing process (surface treatment by oxygen plasma) was applied to the surface of the resist pattern to prepare a mask having the resist pattern as an opaque pattern. The film thickness and the pattern feature size (one side) of the resist pattern were decreased each by about 30 nm by the ashing. The original resist pattern was formed somewhat larger while previously expecting the decrement. An ArF light (ArF excimer laser light) was irradiated to the resist pattern on the mask substrate and the change of the film thickness and the pattern feature size of the resist pattern before and after irradiation was examined. As a result, the film thickness and the pattern feature size of the resist pattern were scarcely changed even after irradiation at 500 $J/cm^2$. For the comparison, when an identical experiment was conducted without the ashing process, the film thickness and the pattern feature size (one side) were decreased each by about 200 nm after irradiation at 500 $J/cm^2$.

It is considered that organic components on the surface of the resist pattern were oxidized and eliminated (evaporated) by the ashing and the remaining Si was oxidized to form oxidized Si thin films, which improved the resistance to the irradiation of the ArF light. Similar effect can be obtained also in a case of applying an ozone treatment instead of the ashing. The effect is significant, particularly, in a case of applying an ozone treatment at high concentration.

The pattern was transferred onto a wafer by an ArF excimer laser exposure apparatus by using the mask described above, and it was confirmed that the resist pattern functioned as a mask opaque pattern.

In a tenth embodiment of the present invention, a compound containing an SiO bond was mixed with radiation sensitive organic compounds which are opaque to KrF light, and they were patterned on a mask substrate.

Specifically, the following negative tone resist material was used. 100 parts by weight of a naphthol resin (weight average molecular weight: 3000) synthesized by polycondensation of 1-naphthol (50 mol %) and 1,6-dihydroxynaphthalene (50 mol %) with 2,6-bis (hydroxymethyl)-p-cresol, 20 parts by weight of 1,3,5-tris (2-hydroxy-2-propyl)benzene as a dissolution inhibitor precursor and 10 parts by weight of triphenylsulfonium trifluoromethane sulfonate photo-acid generator were dissolved in 900 parts by weight of 1-methoxy-2-propanol and, further, a small amount of a surfactant was added to prevent striation. As the compound containing SiO bonds, commercially available epoxycylohexylethyl-cyclopentyl-POSS™ (Aidlich) was added by 20 parts by weight. They were filtered through a teflon membrane filter of 0.2 μm pore size to formulate a solution of a negative tone light sensitive resin composition (resist or mixture).

After dropping the solution on a quartz glass substrate (mask blanks) and spin coating the same, it was subjected to a thermal treatment at 100° C. for 2 min to obtain a film of 0.60 μm thickness. Further, a commercially available aqueous soluble anti-charging agent: Espacer 100 (products, manufactured by Showa Denko K. K.) was coated as an anti-charging film, and a test pattern was written by an electron beam direct writing apparatus (acceleration voltage of electron beams: 50 kV). Then, when a thermal treatment was applied at 80° C. for 2 min and then development was conducted for 60 sec by using an aqueous solution of tetramethyl ammonium hydroxide (2.38%) as a developer, a favorable negative tone pattern having 0.25 μm line/space was obtained at an electron exposure dose of 10 $\mu C/cm^2$. Further, when the light absorption of the negative tone light sensitive resin composition film at a wavelength of 248 nm was measured, it was 8.9 per 1 μm of film thickness.

Further, the following material was used as the positive tone material. An EE-HNA resin was synthesized by esterifying 2-hydroxy-3-naphthoic acid (HNA) as an absorption dye by 2.5 equivalent amount and, further esterifying, ethoxyethyl groups (EE) as protecting groups by 3.0 equivalent amount to a phenol compound TPPA-1000P (manufactured by Honshu Chemical Co.). 100 parts by weight of the EE-HNA resin and 3 parts by weight of triphenylsulfonium trifluoromethane sulfonate as a photoacid generator were dissolved in 600 parts by weight of propylene glycol monomethyl ether acetate and, further, 25 parts by weight of commercially available transcyclohexanediol-isobutyl-POSS™ (Aldrich) was added and dissolved to prepare a resist solution. It was filtered through a filter of 0.2 μm pore size. The resist was coated on a quartz substrate, baked at 120° C. for 2 min and the absorption spectrum of the film was measured by using a ultraviolet visible photo-spectroscopy. As a result, it was found that the absorption at 248 nm was 7.0 for 1.0 μm of film thickness.

Then, the resist was spin coated on a quartz glass substrate (mask blanks) and baked at 120° C. for 5 min to obtain a 0.73 μm film. Then, an aqueous electro-conductive film was coated and a desired pattern was written by an electron beam using an electron beam direct writing apparatus at an acceleration voltage of 50 kV (Hitachi HL-800D). After the electron beam writing, the aqueous electro-conductive film was removed by water washing, baked at 120° C. for 5 min and then developed by an aqueous 2.38 wt % solution of tetramethyl ammonium hydroxide (TMAH) to form a pattern. As a result, a desired positive-tone pattern at a minimum pattern feature size of 0.3 μm with a residual film thickness of 0.72 μm could be formed at an exposure dose of 15 μC/cm$^2$.

The radiation sensitive composition can include those having, as a base resin, polymers at least having a naphthol structure or oligomers at least having a molecular weight of 1000 or more in order to have a composition that is opaque to the KrF light. Further, as the compound containing the SiO bonds, polyhedral oligomeric silsequioxane-pOSS™ (Aldlich) containing various functional groups can be used for example. The POSS™ (Aldlich) may be mixed with the radiation sensitive composition, or may be combined with the base resin.

Then, an ashing process (surface treatment by oxygen plasmas) was applied to the patterned surface of the mixture (radiation sensitive composition) pattern to prepare a mask having the mixture as an opaque pattern. Since the film thickness and the pattern feature size (one side) were decreased each by about 40 nm by ashing, the original mixture pattern was formed somewhat larger by previously expecting the decrement. A KrF light was irradiated to the mixture pattern on the mask substrate and the change of the film thickness and the pattern feature size of the pattern before and after irradiation was examined. As a result, the film thickness and the pattern feature size of the resist pattern were scarcely changed even after irradiation at 600 J/cm$^2$. For the comparison, when an identical experiment was conducted without the ashing process, the film thickness and the pattern feature side (one side) were decreased each by about 100 nm after irradiation at 600 J/cm$^2$. It is considered that organic components on the surface of the mixture film were oxidized and eliminated (evaporated) by the ashing and the remaining SiO component was deposited to (or segregated on) the upper surface and the surface on the side of the pattern to form oxidized Si thin films, which improved the resistance to the irradiation of the KrF light. It is considered that oxidation of the organic components by oxygen and ozone is prevented inside the film. Similar effect can be obtained also in a case of applying an ozone treatment instead of the ashing. The effect is significant, particularly, in a case of applying an ozone treatment at high concentration. The pattern was transferred onto a wafer by an KrF excimer laser exposure apparatus by using the mask described above, and it was confirmed that the resist (the above mixture) pattern functioned as a mask opaque pattern.

An example for KrF excimer laser exposure has been described above but masks having both excellent photo-resistance and opaqueness can be obtained corresponding to various exposure wavelengths by replacing the radiation sensitive organic composition described above with compositions having opaqueness to other wavelengths. For example, since electron beam resists containing phenolic resin as a base resin show high absorption at an ArF wavelength (e.g., 193 nm), when a mask is prepared by the same method for a composition in which such electron beam resists and a compound containing appropriate SiO bonds are mixed, a mask for ArF can be obtained.

In an eleventh embodiment of the present invention, a radiation sensitive composition (resist or mixture) containing SiO bonds having opaqueness to an ArF laser light was patterned on a mask substrate. As the radiation sensitive composition, 100 parts by weight of synthesized 4-hydroxystyrene-5-butylacrylate-4-vinylphenylcyclopentyl-POSS™ (Aldlich) copolymer (molar ratio 40/30/30) and 5 parts by weight of di(t-butylphenyl)iodonium trifluotomethanesulfonate were dissolved in 600 parts by weight of propyleneglycol monomethyl ether acetate, which was filtered through a filter of 0.2 μm pore size to prepare resist solution.

The resist was coated on a quartz substrate, baked at 120° C. for 2 min and the absorption spectrum of the film was measured by using a ultra-violet visible photo-spectroscopy. As a result, it was found that the absorption at 193 nm was 15.0 for 1.0 μm of film thickness.

Then, the resist was spin coated on a quartz glass substrate (mask blanks) and baked at 120° C. for 5 min to obtain a 0.40 μm film. Then, an aqueous electro-conductive film was coated and a desired pattern was written by an electron beam using an electron beam direct writing apparatus at an acceleration voltage of 50 kV (Hitachi HL-800D). After the electron beam writing, the aqueous electro-conductive film was removed by water washing, baked at 120° C. for 5 min and then developed by an aqueous 2.38 wt % solution of tetramethyl ammonium hydroxide (TMAH) to form a pattern. As a result, a desired positive-tone pattern at a minimum pattern feature size of 0.15 μm with a residual film thickness of 0.39 μm could be formed at an exposure dose of 18 μC/cm$^2$.

As another example of the radiation sensitive compositions (resist or mixture), 100 parts by weight of poly(p-hydroxybenzylsilsesquioxane)(HSQ) and 30 parts of methyl-tris(α-diazoacetoacetate)cholate (DAA) were dissolved in 600 parts by weight of propyleneglycol monomethyl ether acetate, which was filtered through a filter of 0.2 μm pore size to prepare a resist solution. The resist was spin coated on a quartz substrate, baked at 120° C. for 2 min and the absorption spectrum of the film was measured by using a ultra-violet visible photo-spectroscopy. As a result, it was found that the absorption at 193 nm was 13.0 for 1.0 μm of film thickness.

Then, the resist was spin coated on a quartz glass substrate (mask blanks) and baked at 120° C. for 5 min to obtain a 0.42 μm film. Then, an aqueous electro-conductive film was coated and a desired pattern was written by an electron beam using an electron beam direct writing apparatus at an acceleration voltage of 50 kV (Hitachi HL-800D). After the electron beam writing, the aqueous electro-conductive film was removed by water washing, and then developed by an aqueous 2.38 wt % solution of tetramethyl ammonium hydroxide (TMAH) to form a pattern. As a result, a desired positive-tone pattern at a minimum pattern feature size of 0.20 μm with a residual film thickness of 0.40 μm could be formed at an exposure dose of 50 μC/cm$^2$.

For the radiation sensitive compositions, an ashing process (surface treatment by oxygen plasmas) was applied to the patterned surface of the mixture pattern was applied to prepare a mask having the radiation sensitive composition as an opaque pattern. Since the film thickness and the pattern feature size (one side) were decreased each by about 60 nm by ashing, the original mixture pattern was formed somewhat larger by previous expecting the decrement. An ArF light was irradiated to the radiation sensitive composition pattern on the mask substrate and the change of the film thickness and the pattern feature size of the pattern before and after irradiation was examined. As a result, the film thickness and the pattern feature size of the resist pattern were scarcely changed even after irradiation at 600 J. For the comparison, when an identical experiment was conducted without the ashing process, the film thickness and the pattern feature side (one side) were decreased each by about 100 nm after irradiation at 600 J.

It is considered that organic components on the surface of the radiation sensitive composition film were oxidized and eliminated (evaporated) by the ashing and the remaining SiO component was deposited to (or segregated on) the upper surface and the surface on the side of the pattern to form oxidized Si thin films, which improved the resistance to the irradiation of the ArF light. It is considered that oxidation of the organic components is prevented by oxygen and ozone inside the film. The pattern was transferred onto a wafer by an ArF excimer laser exposure apparatus by using the mask described above, and it was confirmed that the resist pattern functioned as a mask opaque pattern. Similar effect can be obtained also in a case of applying an ozone treatment instead of the ashing. The effect is significant, particularly, in a case of applying an ozone treatment at high concentration.

An example for ArF excimer laser exposure has been described above. However, masks having both excellent photo-resistance and opaqueness can be obtained corresponding to various exposure wavelengths by replacing the radiation sensitive organic composition described above with compositions having opaqueness to other wavelengths. For example, a mask material for KrF exposure can be obtained by introducing naphthol groups and appropriate functional groups on the side chains of a resin having siloxane or silsequioxane main chain. Further, POSS may also be introduced to the side chains of various naphthol resins.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method for manufacturing an electronic device using a photomask having a desired pattern, the method comprising:

transferring the desired pattern onto a semiconductor substrate by irradiation of an exposure light, wherein the exposure light is one of a KrF excimer laser beam having a wavelength of about 248 nm or a light having a wavelength shorter than about 248 nm;

subjecting one of an electron beam-sensitive material and a photosensitive material to delineating and development to form a resist film, wherein the resist film is formed having a light shielding property against the exposure light, and wherein the resist film is formed having on a surface thereof a resist material that prevents deformation of the desired pattern upon irradiation of the exposure light; and forming the desired pattern using the resist film.

2. The method of claim 1, wherein the irradiation of the exposure light causes the method to further comprise oxidizing and vaporizing the resist film.

3. The method of claim 1, wherein the resist material is a compound which includes at least one of:

an IV group element;

an iodonium compound; and a metal-containing material.

4. The method of claim 3, wherein the IV group element is at least one of Si and Ge.

5. A method for manufacturing an electronic device using a photomask having a desired pattern, the method comprising:

transferring the desired pattern onto a semiconductor substrate by irradiation of exposure light;

subjecting one of an electron beam-sensitive material and a photosensitive material to delineating and development to form a resist film, wherein the resist film is formed having a light shielding property against the exposure light;

forming the desired pattern using the resist film; and overcoating a surface of the resist film with a protection film to prevent oxidation of the resist film.

6. A method for manufacturing an electronic device using a photomask having a desired pattern, comprising the step of:

transferring the desired pattern onto a semiconductor substrate by irradiation of exposure light, wherein the desired pattern is formed by a resist film, the resist film containing a material for preventing oxidation of a surface of the resist film and a mixture of, an organic composition or inorganic composition which is transparent to the exposure light, and an organic composition or inorganic composition having a light shielding property against the exposure light, wherein a mixing ratio of components of the mixture set a predetermined transmittance against the exposure light.

7. The method of claim 6, wherein the predetermined transmittance is set to a value in a range of about 1% to about 25%.

8. The method of claim 6, wherein a phase difference of the exposure light passing through the resist film is about $\pi$ or about $3\pi$.

9. The method of claim 6, wherein the material for preventing the oxidation of the surface of the resist film caused by the irradiation of the exposure light is silicon or germanium.

10. The method of claim 6, wherein a surface of the desired pattern is coated with an organic film to prevent a change in both transmittance and phase of the resist film.

11. The method of claim 1, wherein the irradiation of the exposure light includes irradiating a photomask having the desired pattern with the exposure light using an exposure system, and wherein the exposure system includes a mask stage for holding the photomask and a mask setting room constituted by a housing which encloses the mask stage, the method further comprising setting oxygen concentration of a peripheral area surrounding the mask stage lower than oxygen concentration of ambient air during the irradiation of the exposure light.

12. The method of claim 1, wherein the irradiation of the exposure light includes irradiating a photomask having a desired pattern with exposure light using an exposure system, and wherein the exposure system includes a mask stage for holding the photomask and a mask setting room constituted by a housing which encloses the mask stage, and wherein prior to the irradiation of the exposure light the method further comprises purging a peripheral area surrounding the mask stage with an inert gas atmosphere transparent to the exposure light.

13. A method for manufacturing an electronic device, the method comprising forming a gate electrode using a photomask having a desired pattern, the method comprising transferring the desired pattern onto a semiconductor substrate by irradiation of an exposure light, wherein the exposure light is one of a KrF excimer laser beam having a wavelength of about 248 nm or a light having a wavelength shorter than about 248 nm; subjecting one of an electron beam-sensitive material and a photosensitive material to delineating and development to form a resist film, wherein the resist film is formed having a light shielding property against the exposure light, and wherein the resist film is formed having on a surface thereof a resist material that prevents deformation of the desired pattern upon irradiation of the exposure light; and forming the desired pattern using the resist film.

* * * * *